(12) United States Patent
Yu

(10) Patent No.: US 8,057,690 B2
(45) Date of Patent: Nov. 15, 2011

(54) SINGLE SILICON-ON-INSULATOR (SOI) WAFER ACCELEROMETER FABRICATION

(75) Inventor: Lianzhong Yu, Redmond, WA (US)

(73) Assignee: Honeywell International Inc., Morristown, NJ (US)

( * ) Notice: Subject to any disclaimer, the term of this patent is extended or adjusted under 35 U.S.C. 154(b) by 295 days.

(21) Appl. No.: 12/401,850

(22) Filed: Mar. 11, 2009

(65) Prior Publication Data

US 2010/0233882 A1    Sep. 16, 2010

(51) Int. Cl.
*C03C 15/00* (2006.01)
(52) U.S. Cl. ............... 216/41; 216/74; 216/80; 216/99; 438/712; 438/739; 438/753
(58) Field of Classification Search ............. 216/41, 216/74, 80, 99; 438/712, 739, 753
See application file for complete search history.

(56) References Cited

U.S. PATENT DOCUMENTS

| | | | |
|---|---|---|---|
| 6,916,728 B2 * | 7/2005 | Gogoi et al. | 438/481 |
| 2005/0280106 A1 * | 12/2005 | Kim et al. | 257/414 |
| 2006/0278942 A1 * | 12/2006 | Rubel | 257/415 |
| 2006/0281214 A1 * | 12/2006 | Chilcott | 438/52 |
| 2007/0266787 A1 * | 11/2007 | LaFond et al. | 73/514.01 |

* cited by examiner

*Primary Examiner* — Binh X Tran
(74) *Attorney, Agent, or Firm* — Lowe Graham Jones PLLC

(57) ABSTRACT

Methods for creating at least one micro-electromechanical (MEMS) structure in a silicon-on-insulator (SOI) wafer. The SOI wafer with an extra layer of oxide is etched according to a predefined pattern. A layer of oxide is deposited over exposed surfaces. An etchant selectively removes the oxide to expose the SOI wafer substrate. A portion of the SOI substrate under at least one MEMS structure is removed, thereby releasing the MEMS structure to be used in the formation of an accelerometer.

14 Claims, 4 Drawing Sheets

SINGLE SILICON-ON-INSULATOR (SOI) WAFER ACCELEROMETER FABRICATION

BACKGROUND OF THE INVENTION

Most single silicon-on-insulator (SOI) wafer accelerometer fabrication methods use silicon oxide as a sacrificial layer to release device microstructures. The gap between the device layer and the handle layer is small creating a large parasitic capacitance. The result is degradation in performance of capacitive sensor designs.

SUMMARY OF THE INVENTION

The invention provides a method for creating at least one micro-electromechanical system (MEMS) structure in a silicon-on-insulator (SOI) wafer. A first oxide layer is deposited on the SOI wafer and then the first layer and the top two layers of the SOI wafer (a first substrate layer and a second oxide layer) are etched to a second substrate layer of the SOI wafer according to a predefined pattern. Oxide as used in the present invention is generally silicon dioxide ($SiO_2$.) A second layer of oxide is deposited over surfaces exposed after etching. An anisotropic etch removes only exposed oxide adjacent to the second substrate layer and the first oxide layer, leaving the second oxide layer adjacent to the first substrate layer. The example method etches the exposed second substrate using an anisotropic etchant. A portion of the second substrate under at least one MEMS structure is removed using an isotropic etchant. Next, the exposed oxide is removed. This produces MEMS structures used in the formation of accelerometers.

BRIEF DESCRIPTION OF THE DRAWINGS

Preferred and alternative embodiments of the present invention are described in detail below with reference to the following drawings.

DETAILED DESCRIPTION OF THE INVENTION

The present invention is a method for fabrication of micro-electro-mechanical system (MEMS) components using a single, silicon-on-insulator (SOI) wafer. The method of the present invention generates a gap between a device layer and a substrate layer to release device microstructures. As such, the gap between the device layer and the substrate layer is large enough to avoid creating parasitic capacitance.

Figure 1:
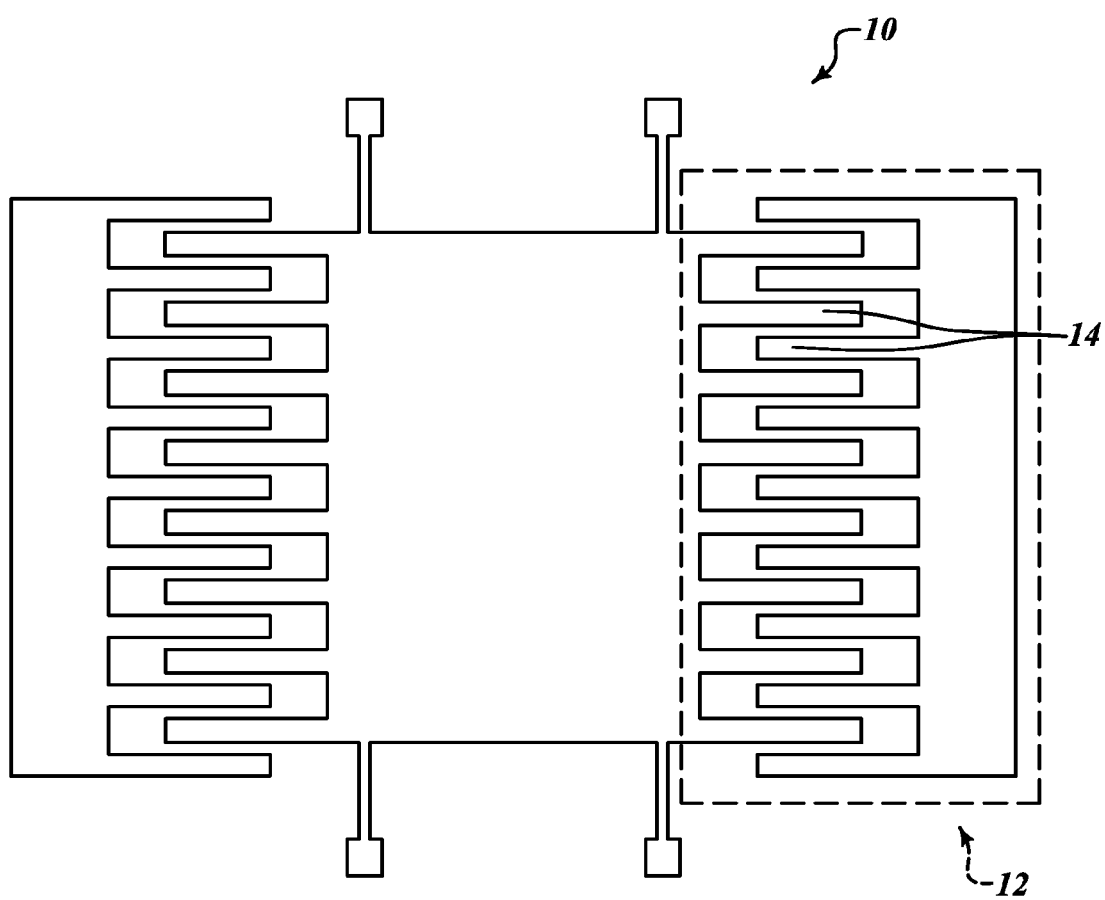
FIG. 1 is a top view of an example accelerometer formed in accordance with the present invention.

FIG. 1 illustrates an accelerometer 10 formed in accordance with an embodiment of the present invention. Fingers 14 of a comb structure 12 are etched to provide increased separation between a substrate layer and the base of the fingers 14. The increased separation provides decreased parasitic capacitance caused by the fingers 14 and substrate layer for an improved capacitive sensor design.

Figure 2:
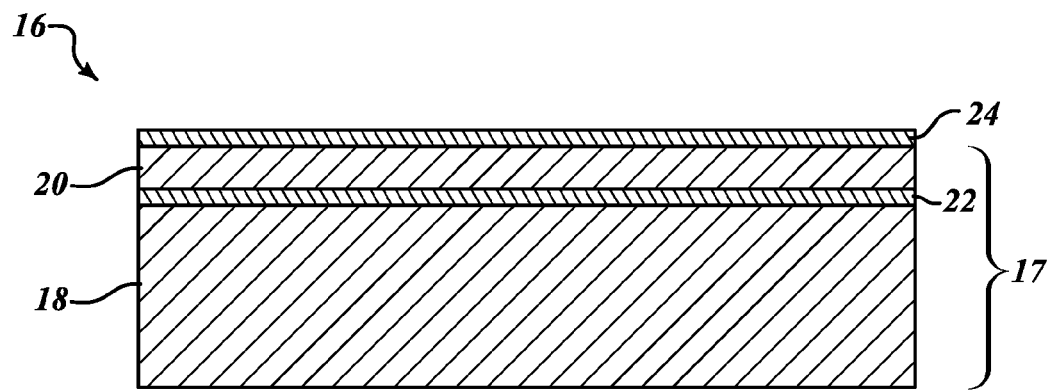
FIGS. 2-7 illustrate cross-sectional views of a silicon-on-insulator (SOI) wafer process to produce the accelerometer show in FIG. 1.

FIG. 2 illustrates a cross-sectional view of wafer 16 with an extra oxide layer 24 deposited on an SOI wafer 17. The SOI wafer 17 includes a silicon handle wafer 18, an insulating silicon dioxide layer 22 disposed on the silicon handle wafer 18 and a silicon mechanical layer 20 disposed on the insulating silicon dioxide layer 22.

Figure 3:
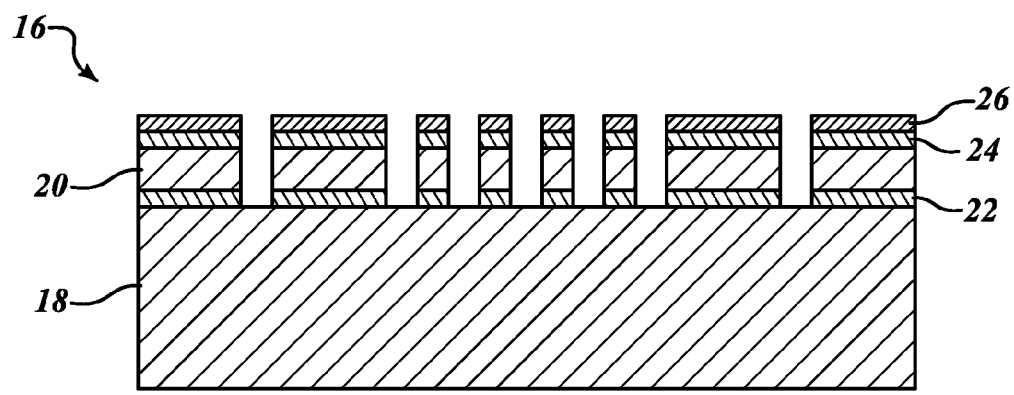

FIG. 3 illustrates processing subsequent to FIG. 2. A photoresist 26 is patterned on the surface of the extra oxide layer 24 according to a predefined pattern. The exposed extra oxide layer 24 (i.e. portion not covered by photoresist) is etched away via an oxide etch, thereby exposing a portion of the silicon mechanical layer 20. Then the subsequently exposed silicon mechanical layer 20 is etched away via a silicon (Si) deep reactive ion etch (DRIE), thereby exposing a portion of the insulating silicon dioxide layer 22. Next, the subsequently exposed insulating silicon dioxide layer 22 is etched away via an oxide etchant.

Figure 4:
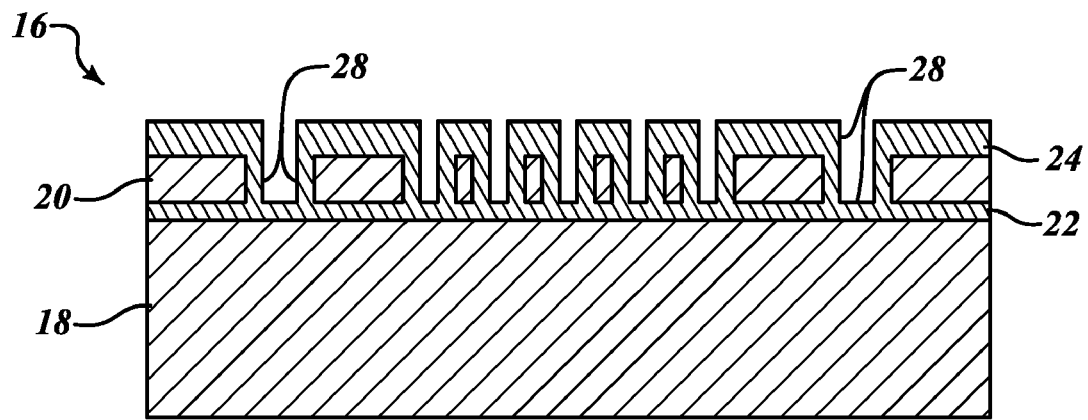

FIG. 4 illustrates processing subsequent to FIG. 3. The photoresist 26 is removed. Another oxide layer 28 is deposited (i.e. grown) on the exposed surfaces of the extra oxide layer 24, the silicon mechanical layer 20 and the silicon handle wafer 18.

Figure 5:
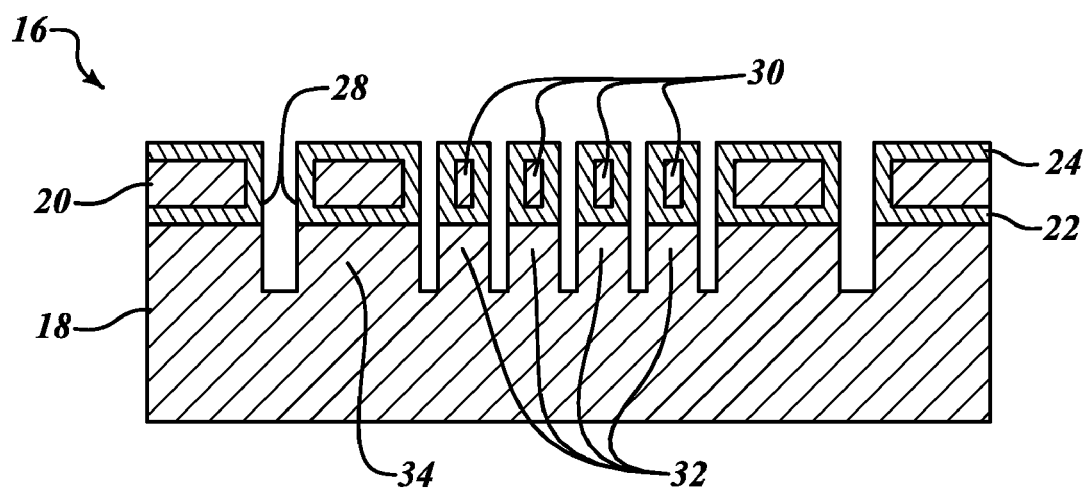

FIG. 5 illustrates processing subsequent to FIG. 4. The oxide layer 28 on the extra oxide layer 24 and the silicon handle wafer 18 is etched away using an anisotropic etchant, leaving the silicon mechanical layer 20 covered with oxide. Next, the subsequently exposed portions of the silicon handle wafer 18 are etched via Si DRIE to a predetermined depth. The DRIE exposes sacrificial silicon support structures 32 and silicon support structures 34.

Figure 6:
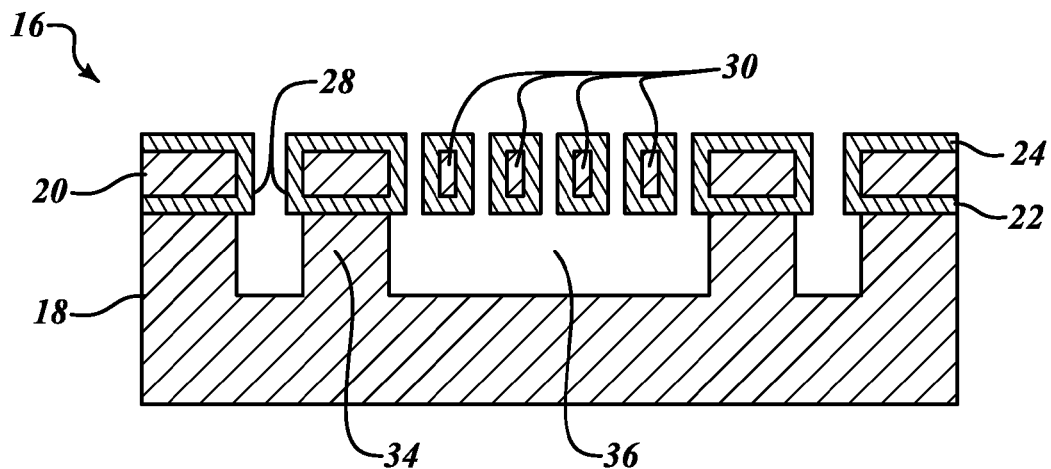

FIG. 6 illustrates processing subsequent to FIG. 5. Device microstructures 30 are released by etching away the sacrificial silicon support structures 32 via an isotropic etch (e.g. Xenon Fluoride (XeF2) vapor etch) which only etches silicon and not the oxide that protects the device microstructures 30. Some of the silicon support structures 34 is removed by the isotropic etch, but not enough to weaken the silicon support structures 34. The removal of the sacrificial silicon support structures 32 creates a gap 36 between the device microstructures 30 and a surface of the silicon handle 18. An alternative embodiment uses a wet etch, such as potassium hydroxide (KOH), ethylene diamine pyrocatechol (EDP) or tetra-methyl ammonium hydroxide (TMAH) to remove the sacrificial silicon support structures 32.

Figure 7:
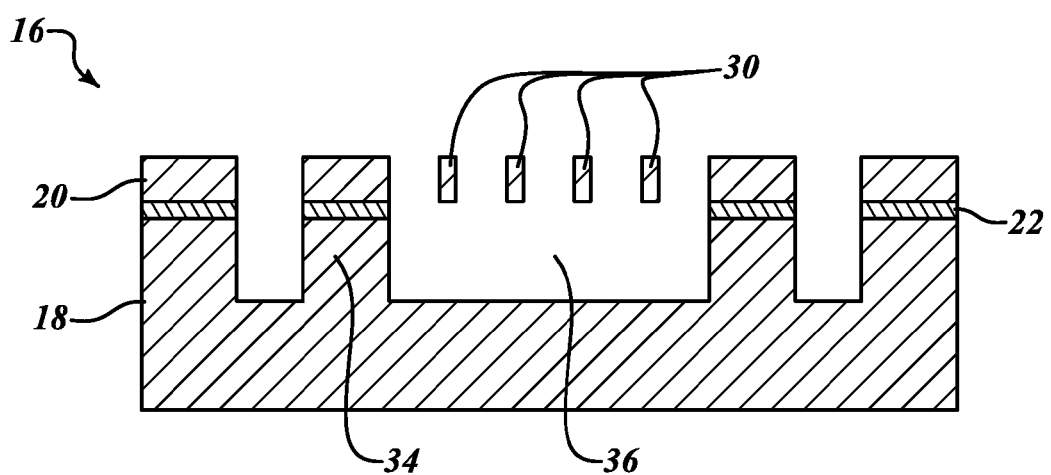

FIG. 7 illustrates processing subsequent to FIG. 6. The remaining extra oxide layer 24 and the oxide layer 28 are etched away using a (hydrofluoric) HF vapor etch exposing the device microstructures 30. An alternative embodiment etches the oxides layers 24, 28 using a buffered oxide etch (BOE).

Using silicon as the sacrificial support structure provides a larger gap 36 which reduces the parasitic capacitance and thus improve the signal/noise ratio performance of the accelerometer device. Distance of the gap 36 is based on specific design of the accelerometer. In one embodiment, the gap 36 is greater than 50 μm, thus allowing for dramatic reduction of parasitic capacitance between the device layer and the substrate. In addition, the extra oxide layer 24 and the oxide layer 28 protects device microstructures 30 from being etched during the silicon etch. This produces stronger device microstructures 30, thereby reducing breakage.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A method for creating at least one micro-electromechanical (MEMS) structure in a wafer having a first insulating layer, a first substrate layer, a second insulating layer and a second substrate layer, the first substrate layer being located between the first insulating layer and the second insulating layer, the second substrate layer being attached to the second insulating layer, the method comprising:

etching through the first insulating layer, the first substrate layer and the second insulating layer to the second substrate layer according to a previously applied mask;

removing the previously applied mask;

generating a layer of oxide over surfaces exposed after etching;

removing only exposed oxide adjacent to the second substrate layer;

etching exposed substrate in the second substrate layer using an anisotropic etchant;

etching portions of exposed substrate from under at least one structure in the first substrate layer using an isotropic etchant; and removing exposed oxide, thereby creating the at least one MEMS structure.

2. The method of claim 1, wherein the first substrate layer, the second insulating layer and the second substrate layer are formed as a silicon-on-insulator (SOI) wafer.

3. The method in claim 1, wherein the first substrate layer comprises silicon.

4. The method of claim 1, wherein the first insulating layer comprises oxide.

5. The method of claim 1, wherein the second substrate layer comprises silicon.

6. The method of claim 1, wherein the second insulating layer comprises oxide.

7. The method of claim 1, wherein etching through the first insulating layer, the first substrate layer and the second insulating layer further comprises etching the first substrate layer using a silicon (Si) deep reactive ion etch (DRIE).

8. The method of claim 1, wherein removing only exposed oxide adjacent to the second substrate layer further comprises removing exposed oxide adjacent to the first insulating layer.

9. The method of claim 1, wherein removing only exposed oxide adjacent to the second substrate layer further comprises using an anisotropic etchant.

10. The method of claim 1, wherein etching the exposed substrate in the second substrate layer using an anisotropic etchant further comprises etching using Si DRIE.

11. The method of claim 1, wherein etching portions of the exposed substrate in the second substrate layer using an isotropic etchant further comprises using Xenon Fluoride (XeF2) etch.

12. The method of claim 1, wherein removing exposed oxide further comprises using a hydrofluoric acid (HF) vapor etch.

13. The method of claim 1 wherein etching portions of the exposed substrate in the second substrate layer using an isotropic etchant further comprises using a wet etchant.

14. The method of claim 13, wherein the wet etchant comprises one of potassium hydroxide (KOH), ethylene diamine pyrocatechol (EDP) or tetra-ethyl ammonium hydroxide (TMAH).

\* \* \* \* \*